United States Patent [19]

Liu et al.

[11] Patent Number: 5,519,336
[45] Date of Patent: May 21, 1996

[54] METHOD FOR ELECTRICALLY CHARACTERIZING THE INSULATOR IN SOI DEVICES

[75] Inventors: Michael S. Liu, Hennepin County; Cheisan J. Yue, Roseville; Paul S. Fechner, Plymouth, all of Minn.

[73] Assignee: Honeywell Inc., Minneapolis, Minn.

[21] Appl. No.: 356,041

[22] Filed: Dec. 6, 1994

Related U.S. Application Data

[63] Continuation of Ser. No. 846,485, Mar. 3, 1992, abandoned.

[51] Int. Cl.$^6$ .................................................. G01R 19/08
[52] U.S. Cl. .................................................. 324/769; 324/765
[58] Field of Search .................................. 324/760, 765, 324/769, 158.1, 73.1, 766; 257/40, 48, 348, 351; 437/8, 81

[56] References Cited

U.S. PATENT DOCUMENTS

| | | | |
|---|---|---|---|
| 4,520,448 | 5/1985 | Treminta | 324/158 T |
| 4,827,212 | 5/1989 | Kamieniecki | 324/158 D |
| 4,896,108 | 1/1990 | Lynch et al. | 324/158 T |
| 4,920,399 | 4/1990 | Hall | 357/42 |
| 5,032,786 | 7/1991 | Kimura | 324/158 T |
| 5,103,277 | 4/1992 | Caviglia et al. | 257/348 |
| 5,164,805 | 11/1992 | Lee | 257/351 |
| 5,308,788 | 5/1994 | Fitch et al. | 437/81 |

OTHER PUBLICATIONS

Sorin Cristoloveanu & Stephen Williams, "Point-Contact Psuedo MOSFET for In-Situ Characterization of As-Grown Silicon-on-Insulator Wafers," Feb. 1992, pp. 102-104.

Lin et al; "Fast Turn Characterization of Simox/Wafers"; 1990 IEEE SOS/SOI technology Conference, Oct. 2-4, 1990.

*Primary Examiner*—Vinh P. Nguyen
*Attorney, Agent, or Firm*—Gregory A. Bruns

[57] ABSTRACT

A rapid method for determining electrical characteristics of SOI wafers whereby the silicon substrate acts as a gate and tungsten probes make a source and drain connection at the top silicon surface to form a point contact transistor. Drain current is measured as a function of gate voltage as gate voltage is swept from negative to positive values. The subthreshold voltage current characteristic exhibits a minimum drain current occurring close to zero gate voltage. The tungsten probe point contacts apparently are responding to both electron and hole conduction or simply intrinsic CMOS behavior. Using current voltage characteristics, estimates may be made of interface state density and oxide charge density. Analysis of the gate voltage shift for minimum drain current allows determination of threshold voltage shift due to radiation.

6 Claims, 3 Drawing Sheets

METHOD FOR ELECTRICALLY CHARACTERIZING THE INSULATOR IN SOI DEVICES

This application is a continuation of application Ser. No. 07/846,485, filed Mar. 3, 1992, now abandoned.

BACKGROUND OF THE INVENTION

The present invention relates generally to semiconductor devices and particularly to silicon on insulator (SOI) devices intended for applications in a radiation environment. The method of the present invention is described with reference to SOI structures having a buried oxide layer. Those knowledgeable in the art will recognize that the invention is not restricted to buried oxide structures but will apply to silicon on sapphire and other SOI material alternatives. Examples of alternatives include bond and etch SOI (BESOI, made by wafer bonding and etch back process) and zone melting recrystallization (ZMR) SOI materials.

High dose oxygen implantation at 200 keV into single-crystalline silicon wafers with a substrate temperature greater than 600° C. followed by very-high-temperature annealing between 1,300° C. and 1,350° C. is now a well established technique for fabrication of SOI structures. These structures are ideal for making CMOS devices such as SRAMs for use in harsh radiation environments. For CMOS devices, the gate oxide, the isolation oxide, and the buried oxide are sensitive to radiation. Most of the investigations in the past have concentrated on the gate oxide and isolation or field oxides. The method of the present patent application is directed toward the electrical characteristics of the buried oxide.

Semiconductor fabricating companies typically obtain wafers from a separate supplier and then perform certain processes on these wafers to produce integrated circuits (IC's). SOI wafers received by a semiconductor fabricating company from their wafer supplier typically undergo certain tests as part of receiving inspection procedures. The specific test procedures are dependent on the particular application. However it is in the interest of the IC fabricator to reliably determine whether certain wafers are acceptable for their intended application with low cost receiving inspection tests where feasible.

An example will illustrate the need for efficient receiving inspection. A supplier of radiation insensitive complimentary metal oxide semiconductors (CMOS) IC's will purchase, for example, SOI wafers that include a top silicon layer, a silicon dioxide layer and a silicon substrate. In the past little has been known about the intrinsic electrical characteristics of the buried oxide front interface, i.e., the back channel. To investigate the back channel radiation characteristics in the past it has been necessary to fabricate the CMOS test structures, that is go through the semiconductor processing steps including many masks, implanting processes and high temperature annealing cycles necessary to the IC fabrication. Often the implantation process causes damage to the buried oxide and causes a degrading of its intrinsic insensitivity to radiation.

Thus a need exists for a method for determining, using relatively low cost receiving inspection tests, whether the characteristics of the silicon dioxide layer are such that it will have the required insensitivity to radiation.

SUMMARY OF THE INVENTION

The present invention solves these and other needs by providing a simple and effective method of evaluating the electrical characteristics of a buried insulator layer.

In a first aspect of the present invention a method is provided for determining certain electrical characteristics of a buried oxide front interface in a SOI wafer. The method includes providing electrical connections to the substrate which acts as the gate and to a drain region and source region. By varying the gate voltage through negative and positive values well below the threshold voltage while measuring the drain current, a voltage current characteristic having a minimum drain current near zero gate voltage is obtained. Evaluation of the slope of the current voltage characteristics allows a determination of interface state density. Evaluation of the minimum drain current allows a determination of oxide charge density. Another aspect of the present invention includes determining the relative shift in gate voltage at which a minimum drain current occurs when the wafer is subjected to a known dose of radiation.

DESCRIPTION OF THE PREFERRED EMBODIMENT

The present invention is directed toward a method for determining the intrinsic electrical properties of a buried oxide layer.

Figure 1:
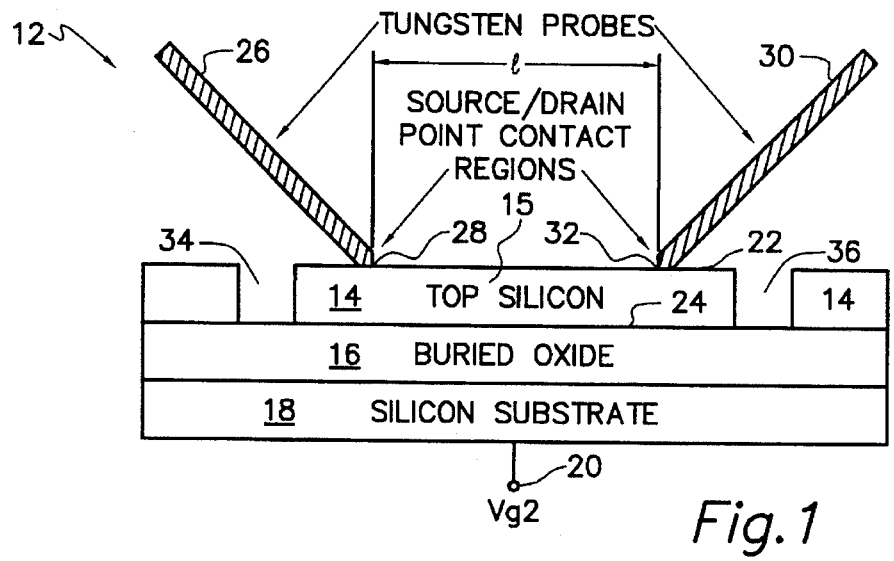
FIG. 1 is a sectional drawing of a test arrangement in accordance with the method of the present invention.

The test arrangement or point contact transistor 12 shown in FIG. 1 illustrates the test method of the present invention. Shown in FIG. 1 is a sectional view of a portion of an SOI wafer formed by the silicon implantation of oxygen (SIMOX) process and having a top silicon layer 14, a buried oxide layer 16, and a silicon substrate 18. Thicknesses are not critical but typically top silicon layer 14 may be 2000 Å and buried oxide layer 16 may be 4000 Å. Top silicon layer portion is of top silicon layer 14 has upper surface 22 and top silicon-buried oxide interface 24. Test arrangement 12 includes substrate terminal 20 for electrical connection to silicon substrate 18. Tungsten probe 26 provides electrical contact with source region 28 at upper surface 22 of top silicon layer portion 15. Tungsten probe 30 provides electrical contact with drain region 32 at upper surface 22 of top silicon layer portion 15. Probe spacing or channel length of the point contact transistor is designated as 1. The back channel 24 lies along the interface of top silicon layer portion 15 with buried oxide layer 16 and between probe 26 and probe 30. Isolation trench 34 and isolation trench 36 extend down to buried oxide layer 16 and isolate top silicon layer portion 15 from the remainder of the top silicon layer 14. Isolated top silicon layer portion 15 forms a silicon island. If the SIMOX SOI wafers do not contain "pipes", i.e., silicon filaments in buried oxide layer 14, then trenches 34 and 36 are not required.

Figure 3:
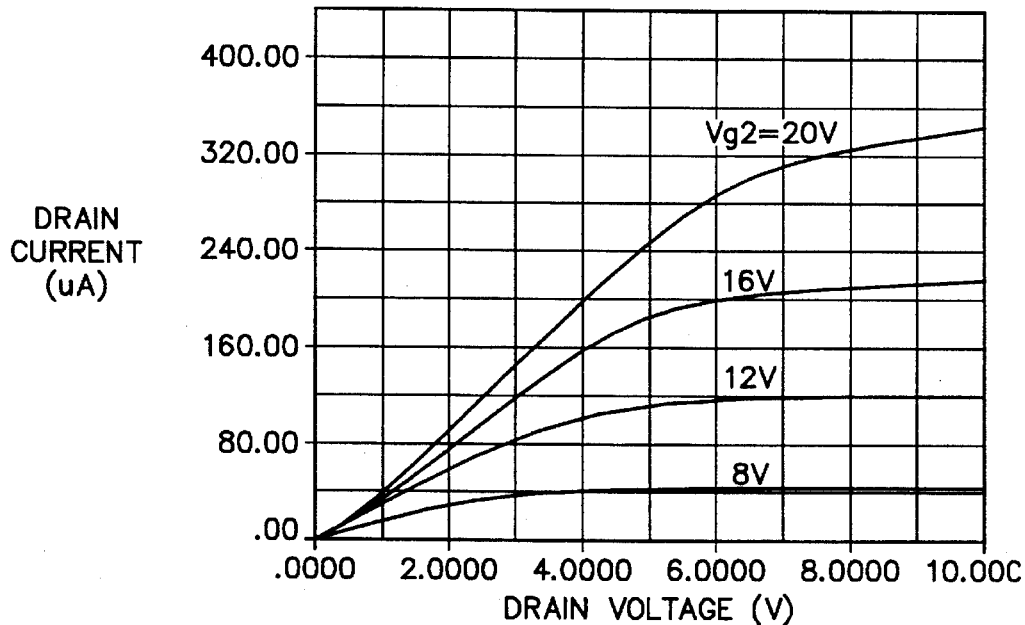
FIG. 3 is a plot of a current voltage characteristic in accordance with the present invention.

To evaluate the use of test structure 12, tests were conducted on SIMOX wafers. The tests and the results are described in the following. FIG. 3 shows the current-voltage characteristics of a point-contact transistor 12 on a typical undoped single implant SIMOX wafer. An implantation dose of $1.8 \times 10^{18}$ cm$^{-2}$ at 620° C. was followed by annealing for 6 hours in argon at 1,325° C. The probe space or channel length is 150 microns. The gate voltage, $V_{G2}$ varies from 0 to +20 volts in steps of +4 volts. Transistor 12 behaves like a normal long-channel NMOS transistor; that is, it shows clear linear and saturation regions.

Figure 4:
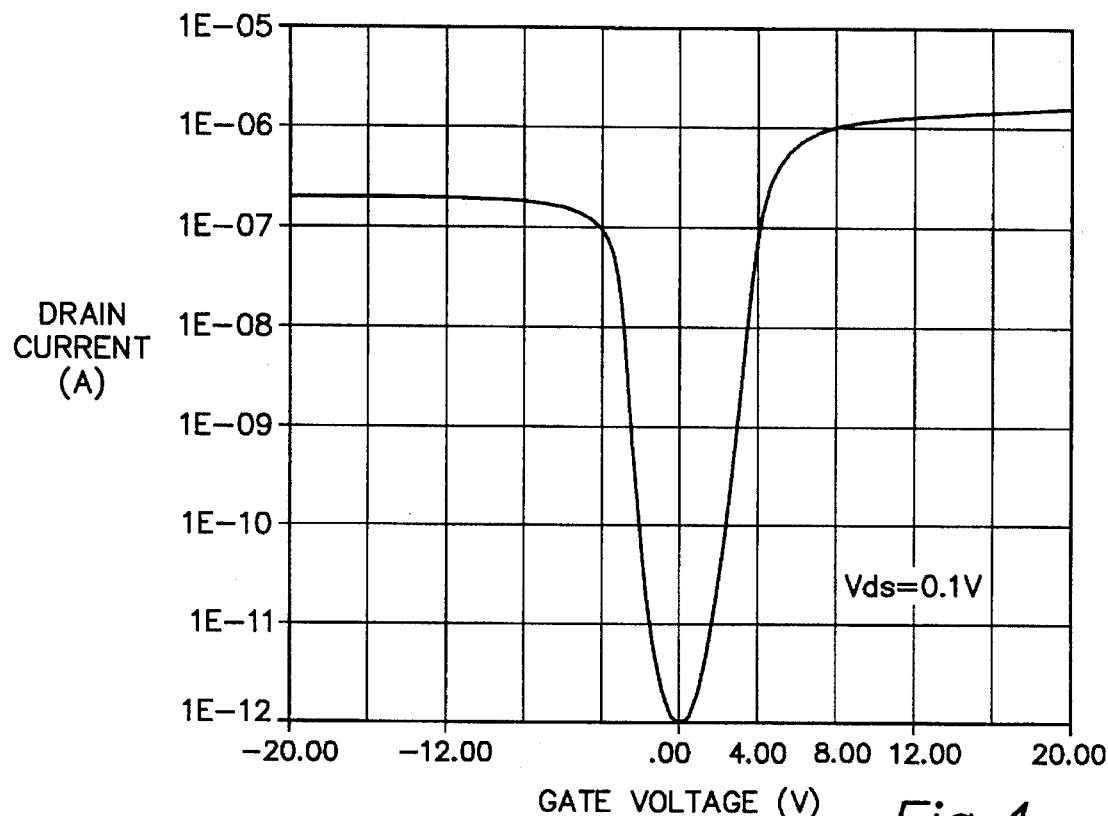
FIG. 4 is a plot of a subthreshold current voltage characteristic in accordance with the present invention.
Figure 5:
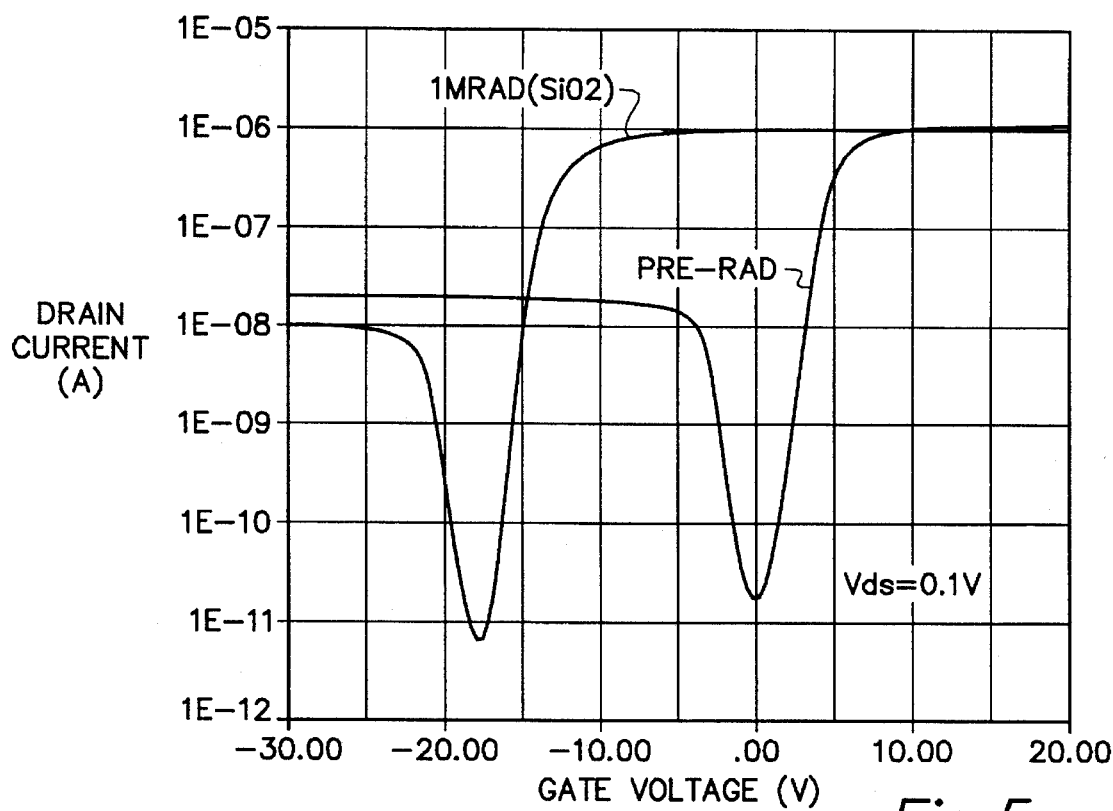
FIG. 5 illustrates back channel threshold voltage shift.

FIG. 5 shows an example of the subthreshold characteristics of point-contact transistor 12 with $V_G$ varying from negative to positive voltage. The subthreshold characteristics do not behave the same way as the conventional MOS transistor. Conventional NMOS transistors only show the subthreshold characteristics in the positive gate voltage range and a leakage level in the negative gate voltage range. Point-contact transistor 12, on the other hand, shows subthreshold characteristics in the negative gate voltage range, a minimum close to zero gate voltage, and subthreshold characteristics in the positive gate voltage range. The curve in FIG. 4 looks very much like a composite plot of both electron and hole conduction, or simply intrinsic CMOS transistor behavior. It is reasoned that the point contacts are responding to both types of carriers since no additional doping has been added to the original, lightly doped ($2 \times 10^{15}$ cm$^3$ boron) starting substrate 18. Given the SIMOX implant and high-temperature annealing process, which should leach out most of the available boron, the top silicon film 14 is expected to be nearly intrinsic. This is easily verified with a four-point probe resistivity measurement under the same bias excursion. A minimum conductivity of $5.6 \times 10^{-6}$ (ohm-cm)$^{-1}$ is observed at the gate voltage at which the minimum current is observed in the subthreshold characteristic. The minimum conductivity, $5.6 \times 10^{-6}$ (ohm-cm)$^{-1}$, is comparable to the theoretical value of $5.0 \times 10^{-6}$ (ohm-cm)$^{-1}$ at room temperature using the expression $$\sigma = q(\mu_n + \mu_p) n_i \qquad (2)$$

where q is the electronic charge, $n_i$ is the intrinsic carrier concentration, and $\mu_n$ and $\mu_p$ are electron and hole mobilities, respectively. The minimum conductivity can also be predicted by a SUPREM-3 simulation. SUPREM is a Stanford University Process Engineering Model. Additionally, SUPREM-3 predicts that for intrinsic doping levels and no fixed charge in the buried oxide this conductivity minimum should occur at essentially zero bias. Net acceptor or donor doping of the top silicon film in the mid-$10^{15}$ cm$^{-3}$ range will shift the IV characteristic by a couple of volts positive or negative respectively, with minimal impact on the shape of the curve. Increasing doping concentrations into the mid-$10^{16}$ cm$^{-3}$ raises the minimum conductivity level and ultimately shields the probe contacts on top of the silicon from the inversion layer at the buried oxide interface. When this happens the conductivity measured by the probes saturates at a minimum value that is controlled by the mobile charge at the top of the silicon layer that has not been depleted out by the backside bias.

In accordance with the present invention, the point-contact transistor measurement is believed to represent the intrinsic property of the back channel since no additional doping or other high-temperature steps are involved. This is another advantage. Although the technique has a contact pressure sensitivity in the maximum output current, it is found to be minimal in the low current regime so that a "threshold voltage" defined at a particular low current value (i.e., 5 nA) and the subthreshold slope are reproducible. This characteristic is used for measuring changes in threshold voltage and subthreshold slope induced by the radiation.

Important information regarding interface state density is contained in the subthreshold slope of FIG. 4. For the example shown in FIG. 4, the interface state density is estimated from the slope of NMOS subthreshold characteristics to be $6 \times 10^{11}$ cm$^{-2}$ eV$^{-1}$ for the back channel, whose interface is the top silicon 14 and implanted buried oxide 16. This value is higher than that of typical thermal gate oxides ($<10^{11}$ cm$^{-2}$ eV$^{-1}$) used for MOS applications. The oxide charge density is estimated from the position of the minimum current to be about $2 \times 10^{10}$ cm$^{-2}$. This is relatively low, but typical for argon anneal at 1,325° C. with small amounts of oxygen and TCA.

In addition to the information obtained with the method of this present invention regarding interface state density and oxide charge density, the invention is also particularly useful in investigating the effects of radiation. The results of such an investigation are as follows.

Typical pre-rad and 1-Mrad point-contact back-channel subthreshold curves are shown in FIG. 5. FIG. 5 also illustrates the asymmetry of the maximum currents, which sometimes occurs due to poor contact to the silicon. However, this does not affect the ability to extract accurate data from the low-current portions of the curves. There is no observable difference in the back-channel threshold voltage shift whether the back gate is grounded or floating during irradiation. The threshold voltage shifts at 1 Mrad(SiO$_2$) are −18, −27.5 and −29 volts, respectively.

Figure 2:
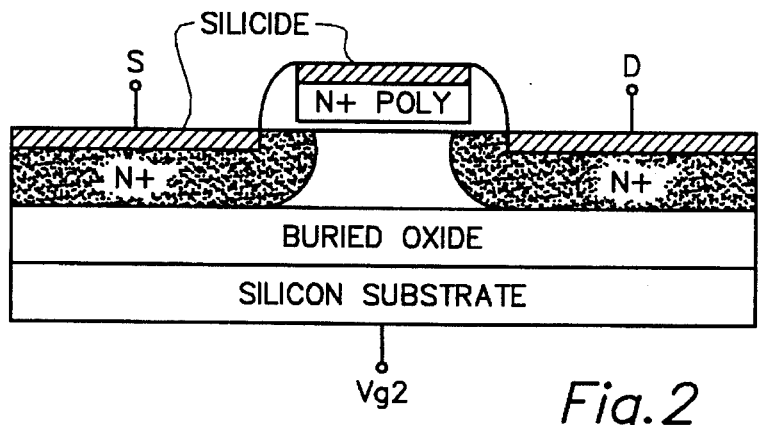
FIG. 2 is a sectional drawing of a special NMOS structure.
Figure 6:
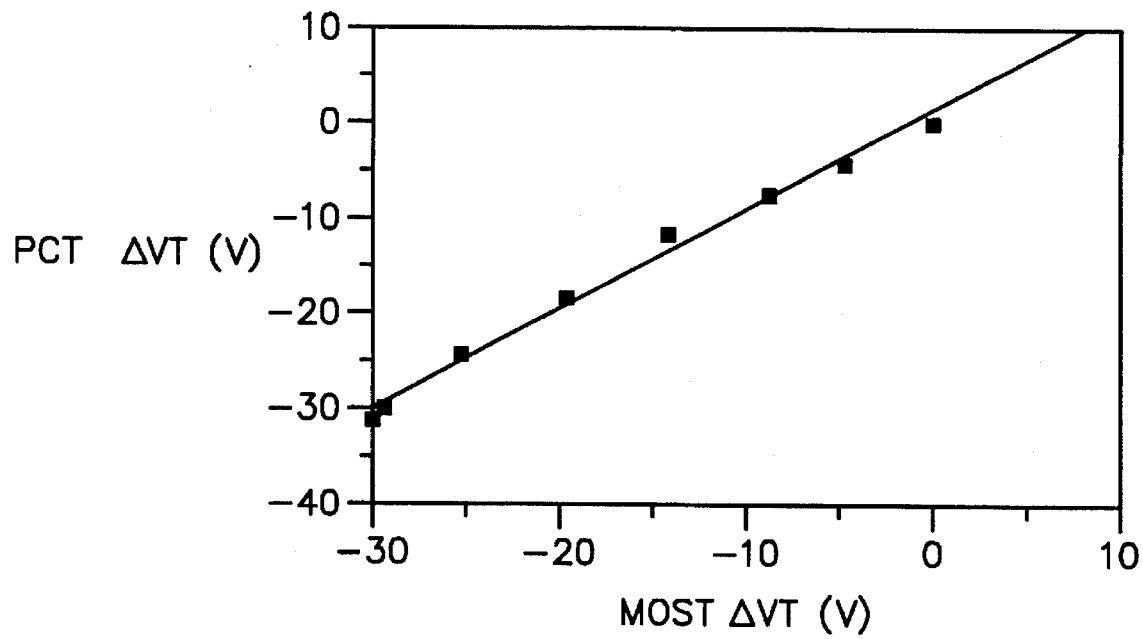
FIG. 6 shows correlation of the radiation-induced threshold voltage shift of a point contact transistor (PCT) and a MOS transistor.

A special NMOS test structure was fabricated for purposes of comparison with the method of the present invention. The special NMOS structure is shown in cross section in FIG. 2. For comparison, the special NMOS transistors were biased $V_D = V_{G2}$ (back gate)=0 and $V_G$=+5 volts. The measured threshold voltage shifts of the back channel of the special MOS transistor with long channel length of 10 μm were −19.5, −27.5, and −28.5 volts at 1, 5, and 10 Mrads(SiO$_2$), respectively. The comparison is shown more clearly in FIG. 6. The two techniques compare quite well. The correlation thus establishes the validity of the method of the present invention.

Figure 7:
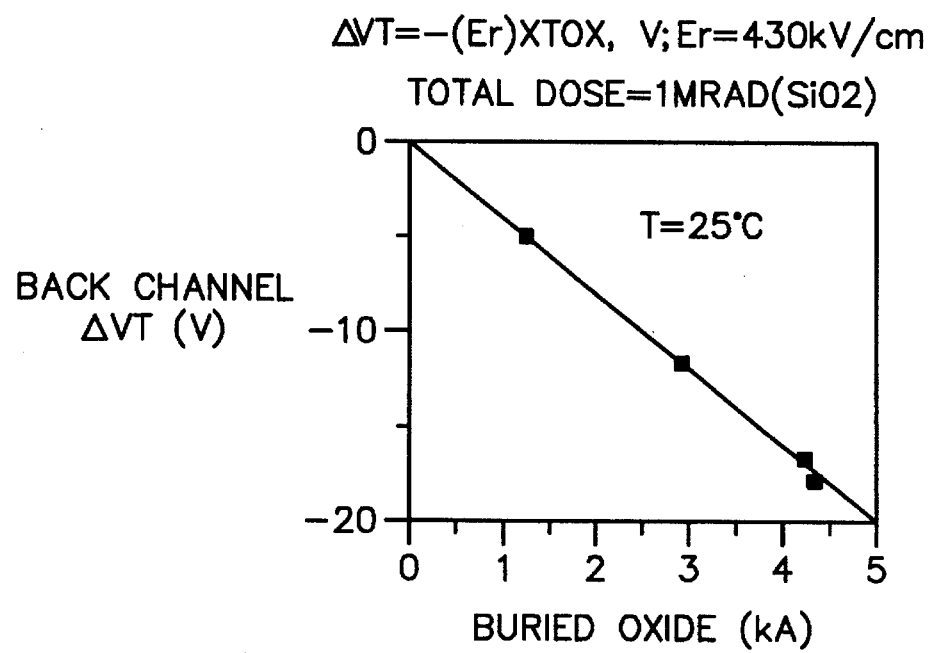
FIG. 7 shows the relationship between the radiation-induced back channel threshold voltage shift and the buried oxide thickness.

When the method of the present invention was used to evaluate SIMOX wafers at total radiation dose of 1 MRad-(SiO$_2$) with different oxygen implant doses from 0.6 to $2.0 \times 10^{18}$ cm$^{-2}$, almost a linear relation between the threshold voltage shifts and the oxygen dose was obtained and is shown in FIG. 7. From FIG. 7, an equivalent charge density of $9.2 \times 10^{11}$ cm$^{-2}$ is found. This is an important property of the buried oxide of this SIMOX wafers annealed in Ar/O$_2$ environment. This radiation-induced charge produces an equivalent electric field of about 430 kV/cm. This value is nearly constant at 1 Mrad(SiO$_2$) for all Ar/O$_2$-annealed SIMOX wafers investigated. Reducing this to values lower than 430 kV/cm is desirable for radiation-hardened processes and techniques to accomplish this are under investigation.

In accordance with the foregoing description, applicants have developed a method of determining certain electrical characteristics of the insulator layer used in SOI structures. This method may be easily incorporated into the test procedures for semiconductor devices. Although a specific embodiment of the applicant's method is shown and described for illustrative purposes, a number of variations and modifications will be apparent to those of ordinary skill in the relevant arts. It is not intended that coverage be limited to the disclosed embodiment, but only by the terms of the following claims.

We claim:

1. A method of determining electrical characteristics of the top silicon to insulator interface in a silicon on insulator (SOI) wafer having a top silicon layer, a buried oxide layer and a silicon substrate, wherein said buried oxide layer is located between said top silicon layer and said silicon substrate, comprising the following steps:

providing a silicon island in said top silicon layer;

providing a first electrical connection to said silicon substrate to serve as a gate terminal;

providing a second electrical probe connection to a designated drain region in said silicon island;

providing a third electrical probe connection to a designated source region in said silicon island;

applying a first variable gate voltage to said gate terminal;

performing a first series of measurements of drain current as a function of said first variable gate voltage; and evaluating said first series of measurements of drain current to determine said electrical characteristics.

2. The method of claim 1 wherein said steps of providing said second and third electrical connections includes placing first and second tungsten probes on said silicon island.

3. The method of claim 1 wherein said step of applying a first variable gate voltage includes varying said gate voltage through negative and positive gate voltage values, and said step of performing a first series of measurements of drain current includes obtaining a first subthreshold characteristic of said drain current as a function of said first variable gate voltage, said first subthreshold characteristic having a slope.

4. The method of claim 3 wherein said step of evaluating said first series of drain current measurements includes determining an interface state density of said top silicon to buried oxide interface from said slope of said first subthreshold characteristic.

5. The method of claim 4 wherein said step of evaluating said first series of drain current measurements includes determining the buried oxide charge density from the position of the minimum current of said first subthreshold characteristic.

6. The method of claim 1 wherein said step of performing a first series of measurements of drain current as a function of said first variable gate voltage includes determining a first threshold gate voltage at which a first minimum of drain current occurs.

* * * * *